United States Patent
Aekins

[11] Patent Number: 5,931,703
[45] Date of Patent: *Aug. 3, 1999

[54] LOW CROSSTALK NOISE CONNECTOR FOR TELECOMMUNICATION SYSTEMS

[75] Inventor: Robert A. Aekins, Stratford, Conn.

[73] Assignee: Hubbell Incorporated, Orange, Conn.

[*] Notice: This patent is subject to a terminal disclaimer.

[21] Appl. No.: 08/795,394

[22] Filed: Feb. 4, 1997

[51] Int. Cl.⁶ .................................................. H01R 23/02
[52] U.S. Cl. .......................................... 439/676; 439/941
[58] Field of Search .................................... 439/676, 941; 379/417

[56] References Cited

U.S. PATENT DOCUMENTS

| | | | |
|---|---|---|---|
| 442,856 | 12/1890 | Carty | 379/417 |
| 2,943,272 | 6/1960 | Feldman | 333/12 |
| 3,496,555 | 2/1970 | Jones | 340/174 |
| 3,757,028 | 9/1973 | Schessel | 174/33 |
| 3,761,842 | 9/1973 | Crandrud | 333/1 |
| 3,891,815 | 6/1975 | Hiele | 335/152 |
| 4,367,908 | 1/1983 | Johnston | 439/676 |
| 4,413,469 | 11/1983 | Paquin | 57/273 |
| 4,481,379 | 11/1984 | Bolick | 174/117 |
| 4,689,441 | 8/1987 | Dick | 174/68.5 |
| 4,767,338 | 8/1988 | Dennis et al. | 439/55 |
| 4,785,135 | 11/1988 | Ecker | 174/34 |
| 4,831,497 | 5/1989 | Webster | 361/406 |
| 4,850,887 | 7/1989 | Sugawara | 439/108 |
| 5,027,088 | 6/1991 | Shimizu | 333/1 |
| 5,039,824 | 8/1991 | Takashima | 174/33 |
| 5,124,567 | 6/1992 | Fujita | 333/12 |
| 5,186,647 | 2/1993 | Denkmann | 437/395 |
| 5,226,835 | 7/1993 | Baker | 439/403 |
| 5,269,708 | 12/1993 | De Young | 439/676 |
| 5,295,869 | 3/1994 | Siemon | 439/620 |
| 5,299,956 | 4/1994 | Brownell | 439/676 |
| 5,414,393 | 5/1995 | Rose | 439/676 |
| 5,432,484 | 7/1995 | Klas | 439/607 |
| 5,618,185 | 4/1997 | Aekins | 439/941 |
| 5,743,750 | 4/1998 | Sullivan et al. | 439/941 |

FOREIGN PATENT DOCUMENTS

| | | |
|---|---|---|
| 0525703 | 2/1983 | European Pat. Off. . |
| 1382013 | 1/1975 | United Kingdom . |
| 1440392 | 6/1976 | United Kingdom . |
| 1449209 | 9/1976 | United Kingdom . |
| 2089122 | 6/1983 | United Kingdom . |

OTHER PUBLICATIONS

Principles of Electricity applied to Telephone and Telegraph Work, American Telephone and Telegraph Co., Jun. 1961.

*Primary Examiner*—Paula Bradley
*Assistant Examiner*—Tho D. Ta
*Attorney, Agent, or Firm*—Jerry M. Presson; Mark S. Bicks

[57] ABSTRACT

A connector for communication systems includes first and second interfaces electrically coupled by a circuit. The first interface has first, second, third and sixth primary terminals arranged in order in a first ordered array. The second interface has a plurality of secondary terminals arranged in a second ordered array. The circuit couples the primary terminals to the respective secondary terminals and cancels crosstalk induced across adjacent terminals. The circuit includes conductive traces connecting the respective primary and secondary terminals. Sections of first and third paths are in relatively close proximity to provide a first reactive coupling between those two paths. Sections of the first and sixth paths are in relatively close proximity to provide a second reactive coupling between those two paths. The sections of the conductive paths have lengths, widths and spacings to cancel the crosstalk induced at the terminals.

24 Claims, 3 Drawing Sheets

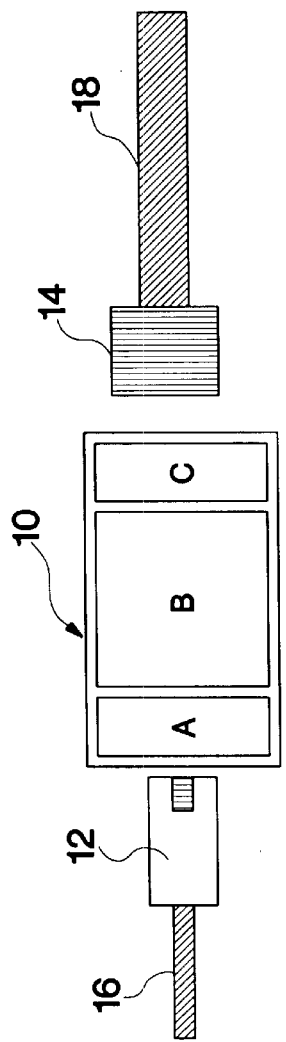
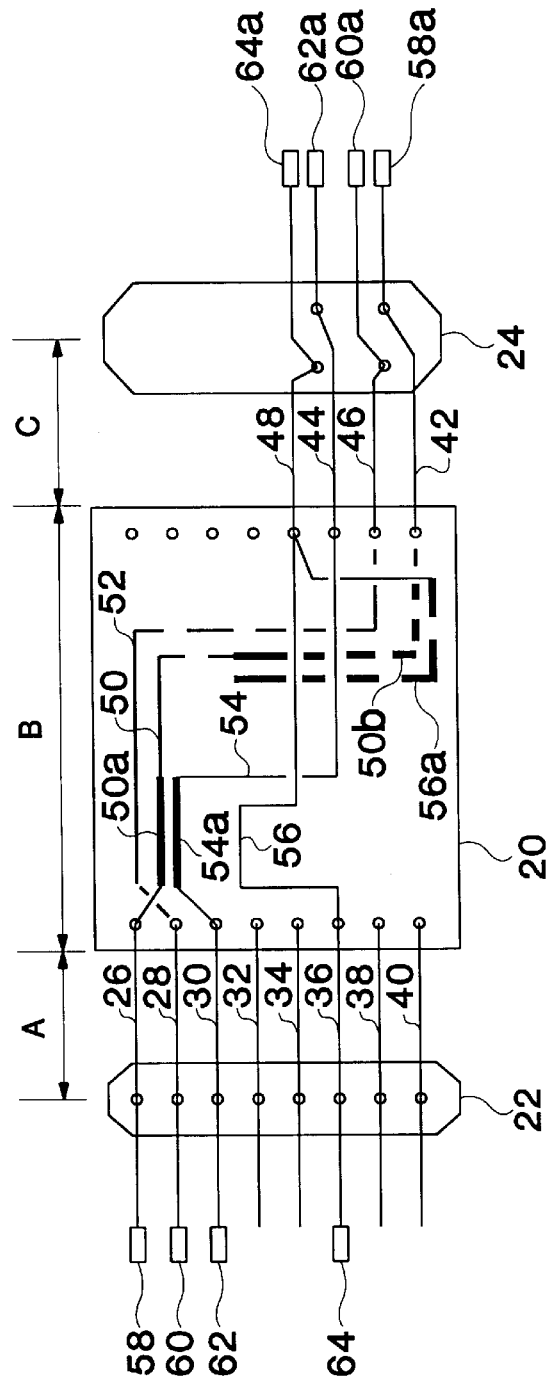

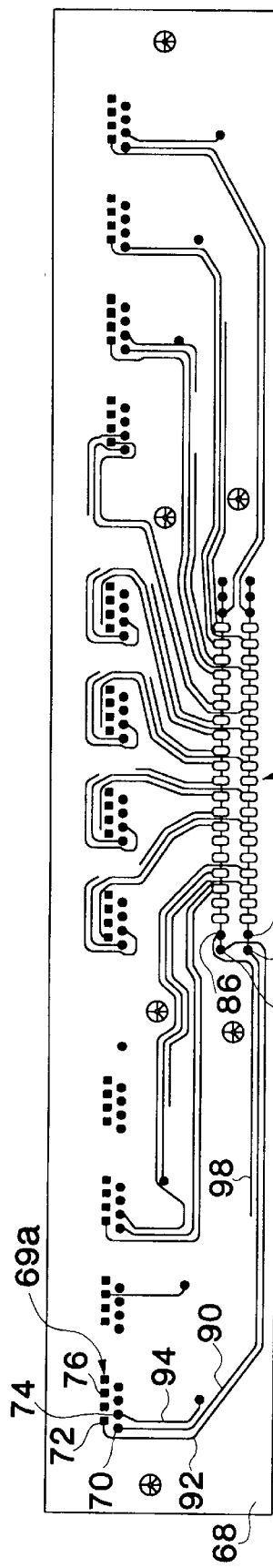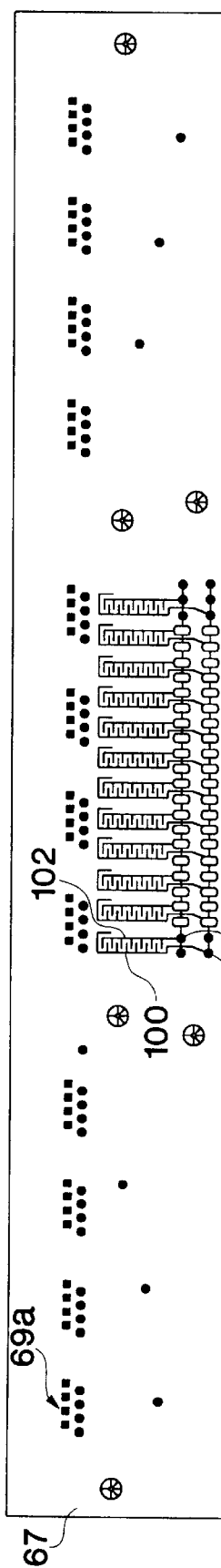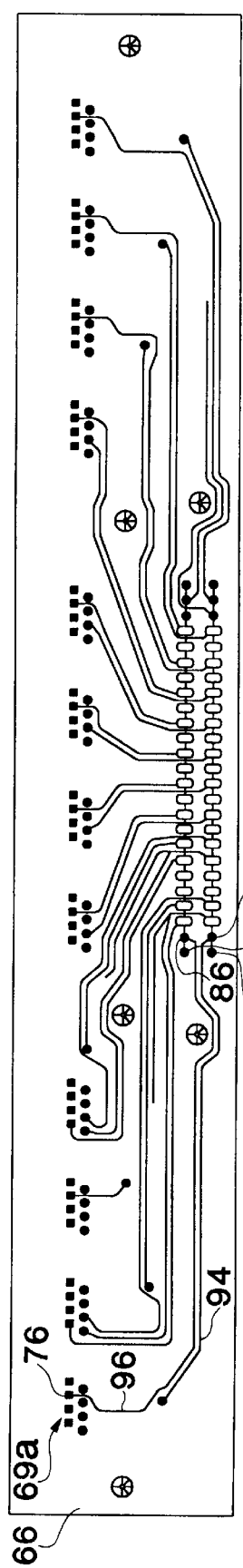

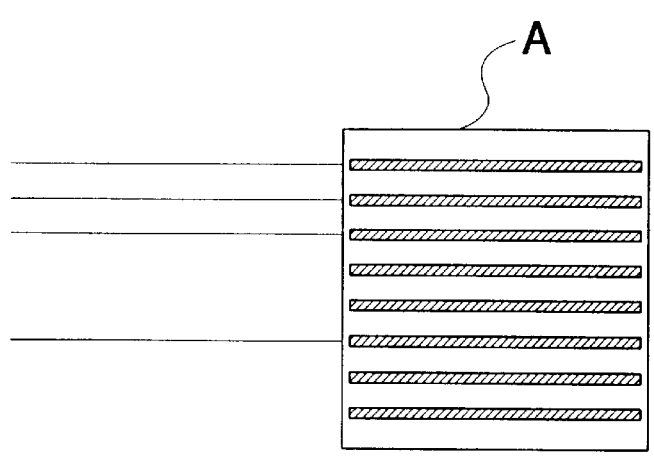
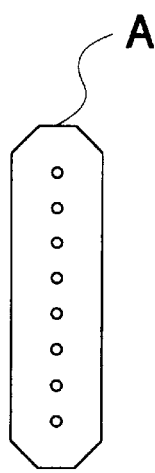
FIG. 6   FIG. 7
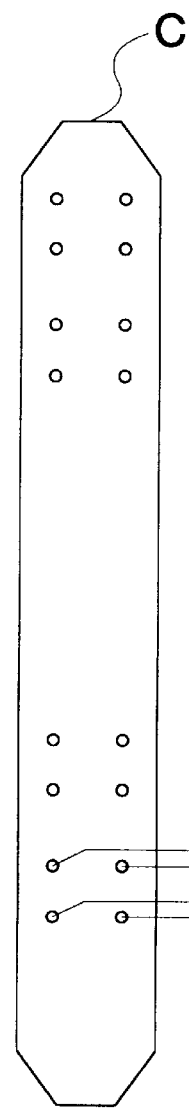
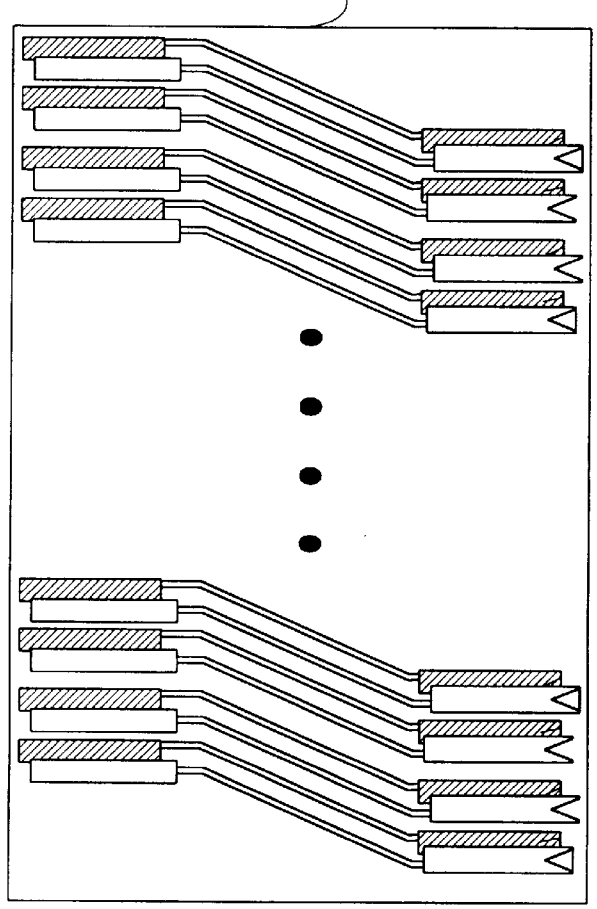
FIG. 8   FIG. 9

LOW CROSSTALK NOISE CONNECTOR FOR TELECOMMUNICATION SYSTEMS

REFERENCE TO RELATED APPLICATIONS

This application is related to U.S. patent application Ser. No. 08/795,396, filed concurrently herewith in the name of Todd J. Bullivant and Michael R. O'Connor and entitled INTERFACE PANEL SYSTEM FOR NETWORKS, the subject matter of which is hereby incorporated by reference.

FIELD OF THE INVENTION

The present invention relates to connectors for communication systems in which crosstalk induced between adjacent terminals of the connectors is canceled. More particularly, the present invention relates to connectors with plural pairs of primary and secondary terminals in differently configured connectors in which the respective primary and secondary terminals are connected in a manner to cancel the effects of induced crosstalk.

BACKGROUND OF THE INVENTION

In local area network (LAN) systems, 25 unshielded twisted pair (UTP) wire systems are widely accepted and used for data and voice transmission. The UTP systems are used because of their low cost and new low noise multi-pair cable design advances. Increased demands on networks using 25 pair UTP systems, including transmission rates, have forced the industry to develop higher system performance standards, such as Electronic Industry Association (EIA) Commercial Building Telecommunication Building Wiring Standards 568A Category 5 level performance. The EIA 568A Category 5 level performance defines electrical parameters for proper data signal systems that require up to 100 Megahertz frequency band width, i.e., Fast Ethernet 100Base-T.

The 25 pair systems allow LAN systems to be easier to manage with the use of 25 pair connectors and 25 pair cables. These 25 pair connectors and cables were originally used for simple telephone service and low speed network systems. However, now such connectors and cables are being considered for use with high speed data systems, as an option. With the increase in LAN data rates, system noise, especially near end crosstalk (NEXT) has also increased.

In data transmission, the received signal will include the transmission signal which is modified by various distortions. The distortions are added by the transmission system, along with unwanted signals inserted into the signals between the transmission point and the reception point. These unwanted signals are referred to as noise. The noise is a major limiting factor in the performance of communication systems. Noise can cause data errors, system malfunctions, and loss of the actual wanted signals. One type of noise is crosstalk noise, which occurs when a signal energy from one line is coupled to another victim line.

Crosstalk can occur when one transmission pair is next to another transmission pair. The capacitive (electric) or inductive (magnetic) fields generated by each transmission pair couple one transmission pair to the other transmission pair.

Crosstalk can be minimized in communication systems by decreasing signal power, increasing the distance between signal lines, providing shielding between signal lines and twisting the wires of each signal pair.

In differential signaling communication systems, plugs such as the AT&T 25 pair Category 5, the EIA 568A T568B (AT&T) 4 pair and the EIA 568A T568B (ISDN) 4 pair Category 5 have defined pin contact assignments. The defined contact layouts produce unwanted crosstalk noises. However, contact reformation to reduce crosstalk is not an option. EIA plugs T568B and T568A 8-pin plug assignments and other similar plugs are not designed for high frequency use. These plugs produce crosstalk since the contacts or terminals are adjacent as a result of the standardized plug design.

Using the standard plug designs causes crosstalk to increase as speeds or system transmission frequencies increase. Crosstalk generated in the cable is minimized by the transposition or twisting of the transmitting pair wires. However, as the signal travels through the untwisted portions of the circuit, such as the plugs and plug contacts, the capacitive and/or inductive coupling occurs to create crosstalk.

In a differential balance two wire per pair transmission signal, the signals traveling along each wire (media) are equal in amplitude, but opposite in phase. The phase difference of the two signals is ±n radian, or voltage=+1(E1)=−voltage−1E(E2), under ideal conditions. These signals, at any instantaneous time, couple electric and/or magnetic fields to adjacent lines, thereby reducing the signal to noise (S/N) ratio. The unacceptable S/N ratio depends on the type or quality of the services required by the system. To remove noise components, a signal equal, but opposite to, the original signal is induced. According to Fourier's wave theory and Maxwell's theory of electromagnetic fields, the coupling of the opposite phase of the transmitted signal to the previously coupled adjacent line signal causes the two signals to cancel each other completely to remove the noise from the adjacent line. This concept is employed in U.S. Pat. No. 5,432,484 to Klas et al, and U.S. Pat. No. 5,414,393 to Rose et al, the subject matter of which are incorporated herein by reference.

In 25 pair connecting hardware, multiple pairs are employed for data signal transmission. The worse case or unwanted coupling effect in the 25 pair or RJ21 plug is different from that in the 4 pair or 4 pair type plug. The worse case near end crosstalk noise in the 4 pair plug creates a balance coupled noise, that is, the noise is coupled equally upon the adjacent pairs. For an EIA T568B 4 pair plug, the worse case noise is typically between pair 1 (pins 4 and 5) and pair 3 (pins 3 and 6). In some 25 pair plugs, the worse case noise is typically between pair 1 (pins 1 and 26) and pair 2 (pins 2 and 27). The 25 pair plug can create unbalanced NEXT noise, i.e., the noise is coupled stronger upon one wire per pair than on the other wire of that pair.

Low noise EIA Category 5 connector designs have used one sided signal compensation methods. While these methods are good for interfaces or single interface design connectors, such methods will not provide Category 5 electrical performance for an interface system of two different plug modules, such as for a 4 pair connector to a 25 pair connector. Thus, an interface is needed which will reduce unwanted near end crosstalk noises created in the use of two different connectors on a single interface, for example using a 4 pair plug system and a 25 pair plug system.

SUMMARY OF THE INVENTION

An object of the present invention is to provide a connector for communication systems which will effectively cancel crosstalk induced across connector terminals.

Another object of the present invention is to provide an interface connector having different connectors which will effectively cancel crosstalk induced across the different connector terminals.

A further object of the present invention is to provide a connector with reduced crosstalk between connector terminals without shielding and without changing the standard connector geometry and pin-out definitions, while still providing a connector which is simple and inexpensive to manufacture and use.

The foregoing objects are basically obtained by a connector for communication systems comprising a first interface, second interface and a circuit coupling the two interfaces. The first interface has first, second, third, fourth, fifth and sixth primary terminals arranged in order in a first ordered array. The second interface has 50 terminals arranged in a second ordered array with first, second, twenty-sixth and twenty-seventh secondary terminals at one end of the second ordered array. The circuit electrically couples the first, third and sixth primary terminals to the first, twenty-sixth, second and twenty-seventh secondary terminals, respectively, and cancels crosstalk induced across adjacent terminals. The circuit includes first, second and sixth conductive paths connecting the first, second, third and sixth primary terminals to the first, twenty-sixth, second and twenty-seventh secondary terminals, respectively. Sections of the first and third paths are in relatively close proximity to provide a first reactive coupling therebetween. Sections of the first and sixth paths are in relatively close proximity to provide a second reactive coupling therebetween. The sections of the conductive paths have lengths, widths and spacings such that induced crosstalk in the terminals is approximately canceled.

The foregoing objects are also obtained by a connector for communication systems comprising first and second interfaces mounted on a printed wiring board. The first interface has a plurality of jacks, with each jack having at least six terminals arranged in order in a first ordered array. The second interface has secondary terminals arranged in two parallel rows in a second ordered array. The printed wiring board has a plurality of circuits coupling groups of four of the secondary terminals with first, second, third and sixth primary terminals in the jacks, respectively, and cancels crosstalk induced across adjacent ones of the terminals. Each circuit includes first, second, third and sixth conductive paths connecting the first, second, third and sixth primary terminals to a respective secondary terminal in each of the groups of the secondary terminals. Sections of the first and third paths are in relatively close proximity to provide a first reactive coupling therebetween. Sections of the first and sixth paths are in relatively close proximity to provide a second reactive coupling therebetween.

By forming the connector in this manner, two different interfaces can be connected in a manner to provide Category 5 electrical performance. In one specific embodiment, a 25 pair connector can be combined with an 4 pair plug module and with a 25 pair plug using twisted pair differential driven media system. The configuration of the two interfaces remains unchanged physically and electrically. The crosstalk is reduced by the hardware connecting the two interfaces by double-ended electrical signal compensation methods. Crosstalk produced by the interface terminals in close proximity is reduced by this connector arrangement.

Other objects, advantages, salient features of the present invention will become apparent from the following detailed description, which, taken in conjunction with the annexed drawings, discloses a preferred embodiment of the present invention.

BRIEF DESCRIPTION OF THE DRAWINGS

Referring to the drawings which form a part of this disclosure:

FIG. 1 is a schematic diagram of a connector system for communication systems according to the present invention;

FIG. 2 is a schematic diagram of a connector for communication systems according to the present invention;

FIGS. 3, 4 and 5 are each plan views of different layers of a printed wiring board for a connector according to the present invention;

FIGS. 6 and 7 are schematic diagrams of a 4 pair plug or interface of the type used in connection with the connector of the present invention; and FIGS. 8 and 9 are schematic diagrams of a 25 pair plug connector or interface for use in connection with the connector of the present invention.

DETAILED DESCRIPTION OF THE INVENTION

As illustrated in FIG. 1, the connector 10 is divided into three sections, a primary section A, a circuit section B, and a secondary section C. The primary section A includes an interface in the nature of a jack for forming an electrical connection with a standard 4 pair plug 12. The secondary section C includes a 25 pair receptacle for mating with a 25 pair plug 14. Plugs 12 and 14 are connected to the ends of multi-conductor electrical cables 16 and 18, respectively.

The plugs, jacks and receptacles are of conventional designs used in telephone and other communication systems, particularly those used for jacks, patch panels and cross-connects. The conventional details of the interface or connector in primary section A and in secondary section C are not described in detail.

Typically, as illustrated in FIGS. 6 and 7, the RJ jack of the primary interface includes 8 terminals arranged in order in an ordered array to provide four pairs. In an RJ45 plug for EIA T568B system, the first pair is provided by terminals 3 and 4, the second pair is provided by terminals 1 and 2, the third pair is provided by terminals 3 and 6, and the fourth pair is provided by terminals 7 and 8. For a EIA T568A system, the first pair is provided by terminals 4 and 5, the second pair is provided by terminals 3 and 6, the third pair is provided by terminals 1 and 2, and the fourth pair is provided by terminals 7 and 8. The terminals of each pair are connected to sources of equal and opposite signals.

As illustrated in FIGS. 8 and 9, the secondary interface connector C is a 25 pair receptacle having an ordered array of terminals comprising two parallel rows of 25 terminals each. Terminals 1 through 25 are located in one row, and terminals 26 through 50 are located in a second, parallel row. Terminals 1 and 26 are located adjacent to each other in the two different rows and are connected to equal and opposite sources, forming a first pair. Similarly, terminals 2 and 27 are located adjacent each other in the two different rows and are connected to signals of equal and opposite sources, forming a second pair. Similar arrangements of pairs are provided for the subsequent groups of four terminals in the secondary interface C.

As illustrated in FIG. 2, circuit section B comprises a printed wiring board 20 on which jack 22 and receptacle 24 are mounted. Jack 22 is of conventional design (e.g., as disclosed in U.S. Pat. No. 5,399,107 to Gentry et al, the subject matter of which is hereby incorporated by reference) having a first primary terminal 26, a second primary terminal 28, a third primary terminal 30, a fourth primary terminal 32, a fifth primary terminal 34, a sixth primary terminal 36, a seventh primary terminal 38, and an eighth primary terminal 40. The primary terminals are arranged in order in a first ordered array.

The receptacle 24 is of a 25 pair design having terminals arranged in two parallel rows. For simplicity, only the first secondary terminal 42, the second secondary terminal 44, the twenty-sixth secondary terminal 46 and the twenty-seventh secondary terminal 48 are illustrated in FIG. 2.

Circuit board 20 comprises four printed circuit traces or conductive paths 50, 52, 54 and 56 printed on a board substrate. Path 50 extends between and connects first primary terminal 26 to first secondary terminal 42. Path 52 extends between and connects second primary terminal 28 to twenty-sixth secondary terminal 46. Third conductive path 54 extends between and connects third primary terminal 30 to second secondary terminal 44. Sixth conductive path 56 extends between and connects sixth primary terminal 36 to twenty-seventh secondary terminal 48.

On circuit board 20, sections 50a and 54a of the first and third paths 50 and 54, respectively, are highlighted with bold lines and are in relatively close proximity to provide a first reactive coupling therebetween. A second section 50b of first path 50 and a section 56a of the sixth path 56 are in close proximity to provide a second reactive coupling therebetween. Section 56a of path 56 extends from terminal 48 independently of the portion of the conductive path extending directly between terminal 36 and terminal 48. The reactive coupling provided between sections 50a and 54a is spaced from the reactive coupling provided between section 50b and 56a.

In a communications system, terminals 26, 28, 30 and 36 are connected to signal sources 58, 60, 62 and 64, respectively. The signal from sources 58 and 60 are equal and opposite (i.e., differently driven) relative to each other. The signals from sources 62 and 64 are equal and opposite to each other. With the application of these two pairs of oppositely or differently driven signals, the crosstalk induced in the printed wiring board 20 in circuit section B tends to cancel the crosstalk induced across and between adjacent terminals in primary section A and secondary section B of the connector.

The length and separation of the traces, the thickness and width of each trace and the dielectric constant of the printed wiring board can be adjusted. With the appropriate adjustment of these factors, the crosstalk signals induced at sections 50a and 54a, and sections of 50b and 56a can be controlled to cancel, at least approximately, the effects of the induced signals or crosstalk resulting from the proximity of terminals in the primary and secondary sections. The factors can also be adjusted to compensate for wiring crosstalk.

The connector 10 is bidirectional. Thus, secondary terminals can be respectively coupled to sources 58a, 60a, 62a and 64a. Sources 58a and 60a provide equal and opposite signals. Sources 62a and 64a produce equal and opposite signals.

FIG. 2 illustrates a circuit or wiring board incorporating the present invention used for connecting 12 modular jacks, each having eight primary terminals, to a single 25 pair connector having fifty secondary terminals. The circuit board is formed of three separate layers 66 (FIG. 3), 67 (FIG. 4) and 68 (FIG. 5).

The first modular jack 69a has a first primary terminal 70, a second primary terminal 72, a third primary terminal 74 and a sixth primary terminal 76. These terminals are connected to the secondary interface or 25 pair connector of receptacle 78. As noted above, connector 78 has fifty terminals arranged in two parallel rows. The terminals of jack 69a are connected to secondary terminals 80, 82, 84 and 86. Specifically, first primary terminal 70 is connected to first secondary terminal 80 by conductive path 90. Second primary terminal 72 is connected to twenty-sixth secondary terminal 84 by conductive path 92. Third primary terminal 74 is connected to second secondary terminal 82 by conductive path 94. Sixth primary terminal 76 is connected to twenty-seventh secondary terminal 86 by conductive path 96. A first reactive coupling between first and third conductive paths 90 and 94 is provided by the close proximity of conductive paths 90 and 94 on layer 68. The second reactive coupling is provided by the section 98 on layer 68, formed as an addition to sixth conductive path 96 and extending independently from twenty-seventh secondary terminal 86. This section 96 extends close to and adjacent to first conductive path 90 to provide a reactive coupling therebetween.

To supplement the reactive coupling between the first and sixth conductive paths 90 and 96, respectively, layer 67 comprises conductive traces 100 and 102 extending from first secondary terminal 80 and twenty-seventh secondary conductive terminal 86, respectively. These conductive traces are in close proximity to provide a third reactive coupling therebetween.

Each of the conductive traces forming the third reactive coupling comprises a long segment and a plurality of short segments extending perpendicularly from the long segment. The long segments of the two traces are parallel. The short segments of the two segments are parallel to each other and are arranged in an alternating and interleaving manner to enhance the reactive coupling between the traces.

Similar arrangements are provided for connecting the first, second, third and sixth primary terminals of each of the twelve modular jacks to a set of four secondary terminals in receptacle 78. Minor variations are provided to facilitate spacing such as extension of the path section, corresponding to section 98 from the primary terminal of a jack rather than the secondary terminal of the receptacle.

In the wiring board, the terminals in the fifty pin receptacle and in the modular jacks for the twelve ports are connected as follows:

| Port | Female 50 pin | Jack Wiring | Female 50 pin | Port |
|------|---------------|-------------|---------------|------|
| 1    | 26            | 1           | 38            | 7    |
|      | 1             | 2           | 13            |      |
|      | 27            | 3           | 39            |      |
|      | 2             | 6           | 14            |      |
| 2    | 28            | 1           | 40            | 8    |
|      | 3             | 2           | 15            |      |
|      | 29            | 3           | 41            |      |
|      | 4             | 6           | 16            |      |
| 3    | 30            | 1           | 42            | 9    |
|      | 5             | 2           | 17            |      |
|      | 31            | 3           | 43            |      |
|      | 6             | 6           | 18            |      |
| 4    | 32            | 1           | 44            | 10   |
|      | 7             | 2           | 19            |      |
|      | 33            | 3           | 45            |      |
|      | 8             | 6           | 20            |      |
| 5    | 34            | 1           | 46            | 11   |
|      | 7             | 2           | 21            |      |
|      | 35            | 3           | 47            |      |
|      | 10            | 6           | 22            |      |
| 6    | 36            | 1           | 48            | 12   |
|      | 11            | 2           | 23            |      |
|      | 37            | 3           | 49            |      |
|      | 12            | 6           | 24            |      |

While embodiments have been chosen to illustrate the invention, it will be understood by those skilled in the art that various changes and modifications can be made therein without departing from the scope of the invention as defined in the appended claims.

What is claimed is:

1. A connector for communication systems, comprising:

a first interface having first, second, third, fourth, fifth and sixth primary terminals arranged in order in a first ordered array;

a second interface having fifty terminals arranged in a second ordered array with first, second, twenty-sixth and twenty-seventh secondary terminals at one end of said second ordered array; and a circuit electrically coupling said first, second, third and sixth primary terminals to said first, twenty-sixth, second and twenty-seventh secondary terminals, respectively, and canceling crosstalk induced across adjacent ones of said terminals, said circuit including first, second, third and sixth conductive paths connecting said first, second, third and sixth primary terminals to the first, twenty-sixth, second and twenty-seventh secondary terminals, respectively, sections of said first and third paths being in relatively close proximity to provide a first reactive coupling therebetween, sections of said first and sixth paths being in relatively close proximity to provide a second reactive coupling therebetween;

said sections of said conductive paths having lengths, widths and spacings such that induced crosstalk in said terminals is approximately canceled.

2. The connector according to claim 1 wherein one of said conductive paths comprises a portion extending between the respective primary and secondary terminals, and said section of said one conduction path extends from the respective terminal independently of said portion thereof.

3. The connector according to claim 1 wherein said sections of said conductive paths forming each of said reactive couplings are parallel.

4. The connector according to claim 1 wherein said sections of said conductive paths forming each of said reactive couplings are parallel and coplanar.

5. The connector according to claim 1 wherein said conductive paths are located on different planes.

6. The connector according to claim 1 wherein said reactive couplings are capacitive couplings.

7. A connector according to claim 1 wherein said reactive couplings are inductive couplings.

8. The connector according to claim 1 wherein said first and second primary terminals are respectively coupled to sources of equal and opposite signals.

9. The connector according to claim 8 wherein said third and sixth primary terminals are coupled to sources of equal and opposite signals.

10. The connector according to claim 1 wherein said first and twenty-seventh secondary terminals have conductive traces extending therefrom in close proximity to provide a third reactive coupling therebetween.

11. The connector according to claim 10 wherein each of said conductive traces forming said third reactive coupling comprises a long segment and short segments extending perpendicularly from said long segment thereof, said long segments being parallel, said short segments being parallel, said short segments of said conductive traces being arranged in an alternating manner.

12. The connector according to claim 1 wherein said circuit comprises a printed wiring board with a dielectric substrate having conductors printed thereon.

13. The connector according to claim 12 wherein said printed wiring board comprises a plurality of layers.

14. A connector for communication systems, comprising:

a first interface having a plurality of jacks, each jack having at least six primary terminals arranged in order in a first ordered array;

a second interface having secondary terminals arranged in two parallel rows in a second ordered array; and a printed wiring board with said first and second interfaces being mounted thereon, said board having a plurality of circuits coupling groups of four of said secondary terminals with first, second, third and sixth primary terminals in one of said jacks, respectively, and canceling crosstalk induced across adjacent terminals, each of said circuits including first, second, third and sixth conductive paths connecting said first, second, third and sixth primary terminals to respective terminals in each of said groups of said secondary terminals, sections of said first and third paths of each of said circuits being in relatively close proximity to provide a first reactive coupling therebetween, sections of said first and sixth paths of each of said circuits being in relatively close proximity to provide a second reactive coupling therebetween.

15. The connector according to claim 14 wherein one of said conductive paths comprises a portion extending between the respective primary and secondary terminals, and said section thereof extends from the respective terminal independently of said portion thereof.

16. The connector according to claim 14 wherein said printed wiring board comprises a plurality of layers.

17. The connector according to claim 14 wherein said sections of said conductive paths forming each of said reactive couplings are parallel.

18. The connector according to claim 14 wherein said sections of said conductive paths forming each of said reactive couplings are parallel and coplanar.

19. The connector according to claim 14 wherein each of said jacks comprises eight primary terminals.

20. The connector according to claim 19 wherein said second interface comprises fifty secondary terminals.

21. The connector according to claim 14 wherein said first and second primary terminals are respectively coupled to sources of equal and opposite signals.

22. The connector according to claim 21 wherein said third and sixth primary terminals are coupled to sources of equal and opposite signals.

23. The connector according to claim 14 wherein conductive traces extend from said secondary terminals in close proximity to provide a third reactive coupling therebetween.

24. The connector according to claim 23 wherein each of said conductive traces providing said third reactive couplings comprises a long segment and short segments extending perpendicularly from said long segment thereof, said long segments being parallel, said short segments being parallel, said short segments from said conductive traces being arranged in an alternating manner.

* * * * *